United States Patent
Jang et al.

(10) Patent No.: US 9,700,950 B2
(45) Date of Patent: Jul. 11, 2017

(54) INNOVATIVE MULTI-PURPOSE DIPPING PLATE

(75) Inventors: Bor-Ping Jang, Chu-Bei (TW); Lin-Wei Wang, Zhubei (TW); Ying-Jui Huang, Taipei (TW); Yi-Li Hsiao, Hsinchu (TW); Chien Ling Hwang, Hsinchu (TW); Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 13/586,132

(22) Filed: Aug. 15, 2012

(65) Prior Publication Data

US 2014/0048586 A1 Feb. 20, 2014

(51) Int. Cl.
| | | |
|---|---|---|
| B23K 1/20 | (2006.01) | |
| B23K 3/08 | (2006.01) | |
| H05K 3/38 | (2006.01) | |
| B23K 1/00 | (2006.01) | |
| H05K 3/34 | (2006.01) | |
| B23K 101/40 | (2006.01) | |

(52) U.S. Cl.
CPC ............ B23K 1/0016 (2013.01); B23K 1/203 (2013.01); B23K 3/082 (2013.01); H05K 3/3489 (2013.01); B23K 2201/40 (2013.01)

(58) Field of Classification Search
CPC ....... B23K 3/082; B23K 1/203; H05K 3/3489
See application file for complete search history.

(56) References Cited

U.S. PATENT DOCUMENTS

| | | | |
|---|---|---|---|
| 5,074,455 A | 12/1991 | Peana et al. | |
| 5,358,252 A * | 10/1994 | McPhaul | A63F 3/00214 273/241 |
| 5,482,736 A | 1/1996 | Glenn et al. | |
| D374,688 S * | 10/1996 | Furlong | D21/336 |
| 6,789,720 B2 * | 9/2004 | Uchida | B23K 3/0669 228/102 |
| 7,032,807 B2 * | 4/2006 | Bayot | 228/180.22 |
| 2005/0045914 A1 * | 3/2005 | Agranat et al. | 257/200 |
| 2009/0250504 A1 * | 10/2009 | Chang et al. | 228/36 |

FOREIGN PATENT DOCUMENTS

| | | | |
|---|---|---|---|
| CN | 202277943 U | * | 6/2012 |
| JP | 2003298292 A | * | 10/2003 |

* cited by examiner

*Primary Examiner* — Keith Walker
*Assistant Examiner* — Jacky Yuen
(74) *Attorney, Agent, or Firm* — Eschweiler & Potashnik, LLC

(57) ABSTRACT

The present disclosure is directed to an apparatus for the application of soldering flux to a semiconductor workpiece. In some embodiments the apparatus comprises a dipping plate having a reservoir which is adapted to containing different depths of flux material. In some embodiments, the reservoir comprises at least two landing regions having sidewalls which form first and second dipping zones. The disclosed apparatus can allow dipping of the semiconductor workpiece in different depths of soldering flux without the necessity for changing dipping plates.

19 Claims, 4 Drawing Sheets

INNOVATIVE MULTI-PURPOSE DIPPING PLATE

BACKGROUND

Within the electronics industry, soldering remains the technique of choice for bonding the leads of an electronic component to a corresponding pattern of metallized areas on a printed circuit board. In carrying out the soldering process, a quantity of solder flux is often applied either to the component leads, or more frequently, to the metallized areas on the circuit board. The flux, which is generally comprised of an activator, a solid vehicle, and a solvent, acts as both a wetting and cleaning agent to enhance the quality of the solder bond between the lead and metallized area on the circuit board. Flux also minimizes metallic oxidation which can occur at soldering temperatures. The result is improved reliability of the electrical connection.

DETAILED DESCRIPTION

Figure 1A:
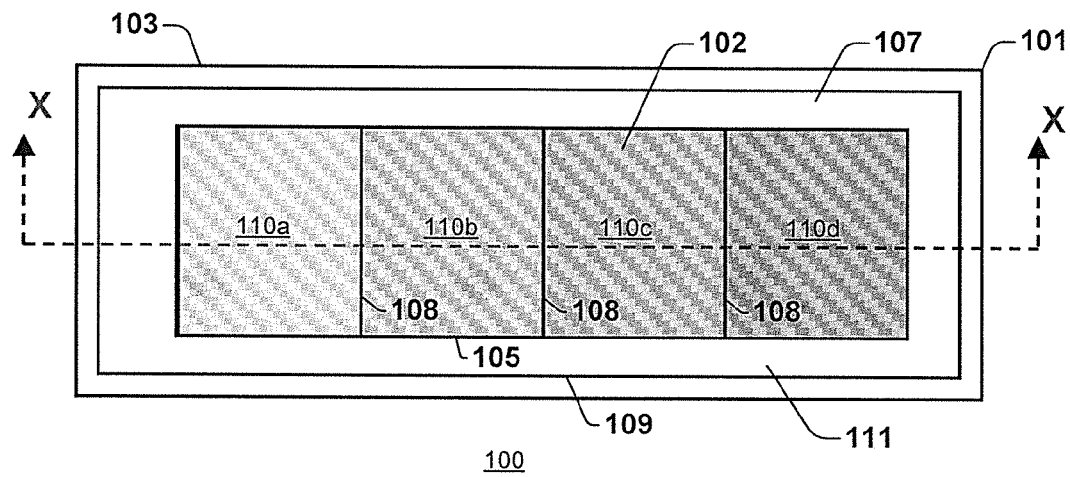
FIG. 1A illustrates a perspective view of a dipping plate in accordance with an embodiment of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Integrated circuit devices are typically electronically packaged by mounting one or more integrated circuit (IC) chips or dies to a substrate, sometimes referred to as a "carrier". In the packaging process, the die is "bumped" with solder to form a plurality of discrete solder balls over metal contacts on the surface of the die. The die can then be mounted to a substrate. Typically, the metal contacts of the substrate are coated with a solder alloy. Electrical interconnection of the die to the substrate is conventionally performed by aligning the die to the substrate and reflowing the solder on the die and/or the substrate to electrically and mechanically join the parts.

Typically, a flux composition is applied to either a die or a substrate to facilitate the formation of an interconnect. Flux is configured to act as an adhesive to hold the placed components in place pending soldering and further acts to clean surface oxides from the substrate and to minimize metallic oxidation that occurs at soldering temperatures thereby improving the electrical and mechanical interconnection and reliability between the soldered component and substrate.

Soldering fluxes fall into three broad categories: rosin fluxes, water-soluble fluxes, and no-clean fluxes. Rosin fluxes, which have a relatively long history of use and are still widely used in the electronics industry. Water-soluble fluxes, which are a more recent development and which are increasingly used in consumer electronics, are highly corrosive materials. No-clean fluxes, a very recent development, reportedly do not require removal from the circuit assemblies. The most common flux for IC die attach packaging comprises a suspension liquid of various acids suspended in an alcohol base.

It has been observed that controlling the amount of applied flux is important irrespective of the type of flux employed in a particular packaging process, since enough flux must be used to effect a reliable metallurgical bond to electrically and mechanically interconnect the component to the substrate. No flux or insufficient flux can result in cold joint. Too much applied flux, however, can undesirably cause displacement of the placed component due to flux boiling. Excess flux further adversely impacts other circuit board manufacturing processes, and can result in adjacent solders, pads or traces shorting to each other, resulting in bridging.

Flux has been applied in the past using a variety of manual and automated methods. Popular methods include dipping, brushing, syringe dispensing, spraying, or atomizing flux onto the component and/or substrate prior to placement of the component on the substrate. Transfer methods of applying flux also may be used.

In a conventional dipping method, two common types of dip stations are rotary stations and linear stations. The rotary station uses a squeegee or doctor blade to determine flux height. In a linear station system, plates having flux wells of a fixed depth are utilized. Flux thickness is determined by the depth of the flux well and the surface tension of the fluxing fluid.

Current dipping stations utilize dipping plates with a single fixed thickness per plate. However, owing to changes in bump height, bump diameter, pre-solder type, and metal finish on the substrate, among others, dipping plates must be exchanged to achieve different flux thicknesses. As a result, the process is interrupted, thereby resulting in decreased throughput as well as the inability to utilize process controls which would allow for real time fine tuning of flux thickness.

Accordingly, the present disclosure is directed to an apparatus for the application of a soldering flux to a semiconductor substrate. In some embodiments the disclosed apparatus comprises a dipping plate having a reservoir configured to contain a plurality of depths of flux. The plurality of depths of flux in one dipping plate eliminates the necessity for changing of the dipping plate having one depth to a dipping plate having a different depth, thereby, in one embodiment, increasing throughput and decreasing processing time.

As shown in FIG. 1, there is illustrated a first embodiment of an apparatus 100 for application of a soldering flux to a workpiece. The apparatus 100 includes a dipping plate 101 and a support 103 for supporting the dipping plate 101 in a position to maintain a uniform level of flux material therein while flux is applied to the workpiece. The workpiece can be any semiconductor die or semiconductor package for which flux dipping is needed. For example, the workpiece can be a printed circuit board having a plurality of conductive terminals arranged on a surface thereof, or a plurality of flip-chip type electrical components. Bond pads or solder bumps can be formed on the semiconductor package that will be electrically connected to corresponding structures on the semiconductor die. The die can be made on, for example, a silicon substrate or a gallium arsenide substrate. Bond pads or solder bumps can be formed on the die corresponding to the bond pads and bumps formed on the semiconductor package. The bump material can be a variety of Pb-based or Pb-free solders.

Figure 1B:
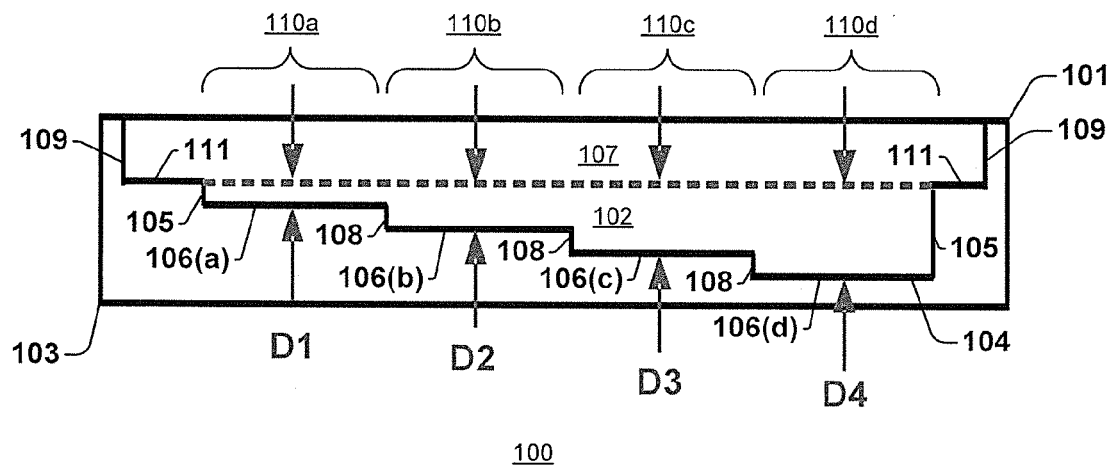
FIG. 1B illustrates a cross-section view along lines X-X of the dipping plate of FIG. 1A in accordance with an embodiment of the disclosure.

The dipping plate 101 contains an inner reservoir 102 having a stepped bottom 104 and circumscribed by inner reservoir sidewalls 105, thereby configuring the inner reservoir 102 to contain a plurality of depths of flux, as indicated by (D1), (D2), (D3) and (D4) in FIG. 1B, which are collectively referred to herein as "D". The stepped bottom 104 includes, in one embodiment, at least two landing regions 106(a), 106(b). Landing regions 106(a), 106(b) are formed by sidewalls 108 which meet between landing regions 106(a), 106(b) to form a first dipping zone 110(a) and a second dipping zone 110(b). In one embodiment, sidewalls 108 are vertical sidewalls. It is contemplated that additional dipping zones 110 can be included. In the embodiment illustrated in FIG. 1B, there are illustrated four dipping zones formed by landing regions 106 (a-d). In one embodiment the dipping plate 101 can comprise from about 4 to about 6 dipping zones. However, it is contemplated that additional dipping zones are possible. The flux dipping plate 101 also includes an outer reservoir 107, which is bounded by outer reservoir sidewalls 109. The outer reservoir 107 has a lower surface 111 that corresponds to an upper lip of the inner reservoir 102. The outer reservoir 107 has an outer reservoir perimeter, as defined by outer reservoir sidewalls 109, which circumscribes a perimeter of the inner reservoir 102, as defined by inner reservoir sidewalls 105.

The first dipping zone 110(a) of reservoir 102 has a first depth, as indicated by D1 in FIG. 1B. Second dipping zone 110(b) has a second depth, as indicated by D2. Additional dipping zones 110(c) and 110 (d) will have depths D3 and D4, respectively, different from depth D1 of first dipping zone 110(a) and depth D2 of second dipping zone 110(b). In the embodiment of the disclosure illustrated in FIG. 1B, dipping zones 110 (a-d) are positioned in a rectangular arrangement, with depth D1 of first dipping zone 110(a) being less than depth D2 of second dipping zone 110(b), while depth D2 of second dipping zone 110(b) is less than depth D3 of dipping zone 110(c), such that depths of the dipping zones 110 increase in a linear direction across a length of the dipping plate 101. However, it is contemplated that the stepped bottom 104 of reservoir 102 may have dipping zones 110 depths which alternate in depth across the length of the dipping plate such that, in one embodiment, a deep dipping zone 110 is followed by a shallow dipping zone, which is followed by a shallow dipping zone 110.

In one embodiment, as is shown if FIG. 1B, first 110(a) and second 110 (b) dipping zones are in fluid connection with each other such that flux material is allowed to flow across first 106(a) and second 106(b) landing zones. Where additional dipping zones 110 are present in the dipping plate 101, these will also be in fluid connection with the first 106(a) and second 106(b) landing zones.

Figure 2A:
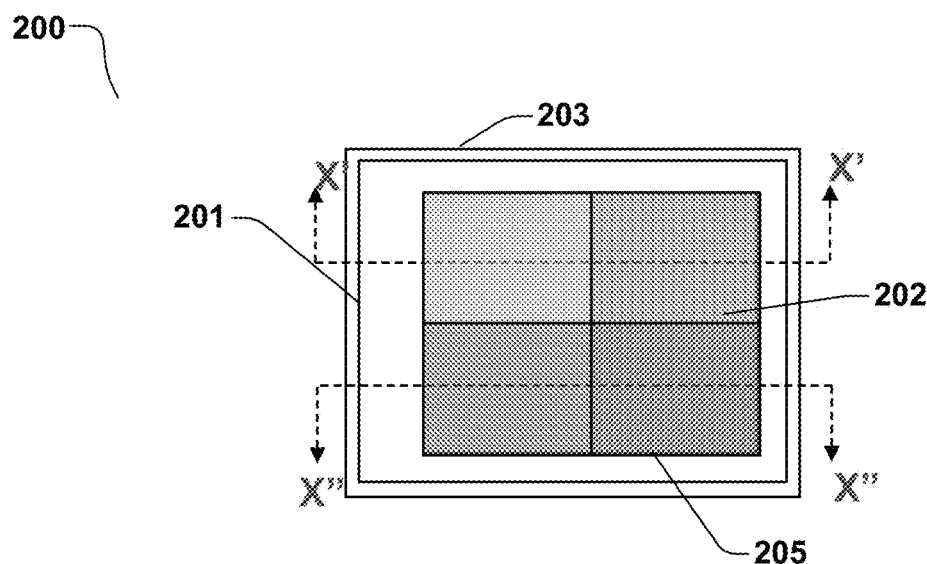
FIG. 2A illustrates a perspective view of an alternative embodiment of a dipping plate in accordance with the disclosure.
Figure 2B:
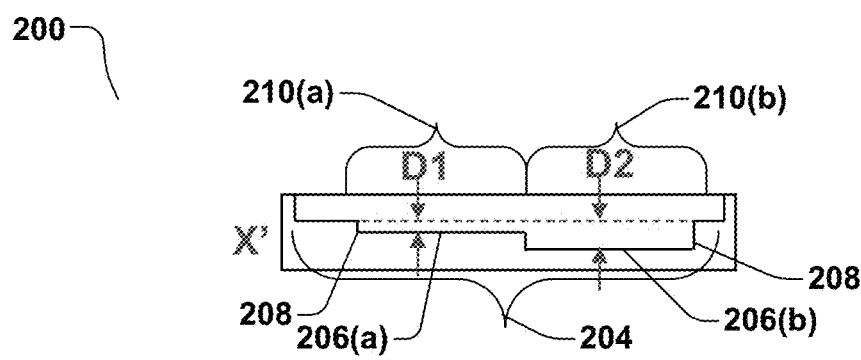
FIG. 2B illustrates a cross-sectional view along lines X'-X' and X"-X" of an embodiment of a dipping plate of FIG. 2A in accordance with the disclosure.
Figure 2B:
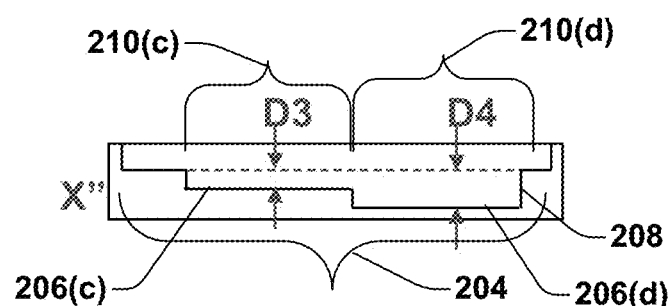

A further embodiment of a dipping apparatus 200 disclosed herein is illustrated in FIG. 2A. In this embodiment, apparatus 200 includes a support 203 for holding dipping plate 201. Inner reservoir 202 includes a stepped bottom 204, as illustrated in FIG. 2B, to define a plurality of depths of flux within inner reservoir 202. At least two landing regions 206(a), 206(b) are formed by vertical sidewalls 208 which meet between landing regions 206(a), 206(b). Landing region 206(a), together with sidewall 208 form a first dipping zone 210(a), while landing region 206(b) with sidewall 208 form a second dipping zone 210(b). In the embodiment illustrated in FIG. 2A, dipping zones 210(a-d) are positioned in a square arrangement, with the first dipping zone 210(a) of reservoir 202 having a first depth, as indicated by D1 in FIG. 2B. Second dipping zone 210(b) has a second depth, as indicated by D2. Additional dipping zones 210(c) and 210(d) have depths D3 and D4, respectively, different from first dipping zone 210(a) and second dipping zone 210(b), and are all in fluid connection with first 210(a) and second 210(b) dipping zones. The flux dipping plate 201 also includes an outer reservoir 207, which is bounded by outer reservoir sidewalls 207. The outer reservoir 207 has a lower surface 211 that corresponds to an upper lip of the inner reservoir 202. The outer reservoir 207 has an outer reservoir perimeter that circumscribes a perimeter of the inner reservoir 202.

Figure 3A:
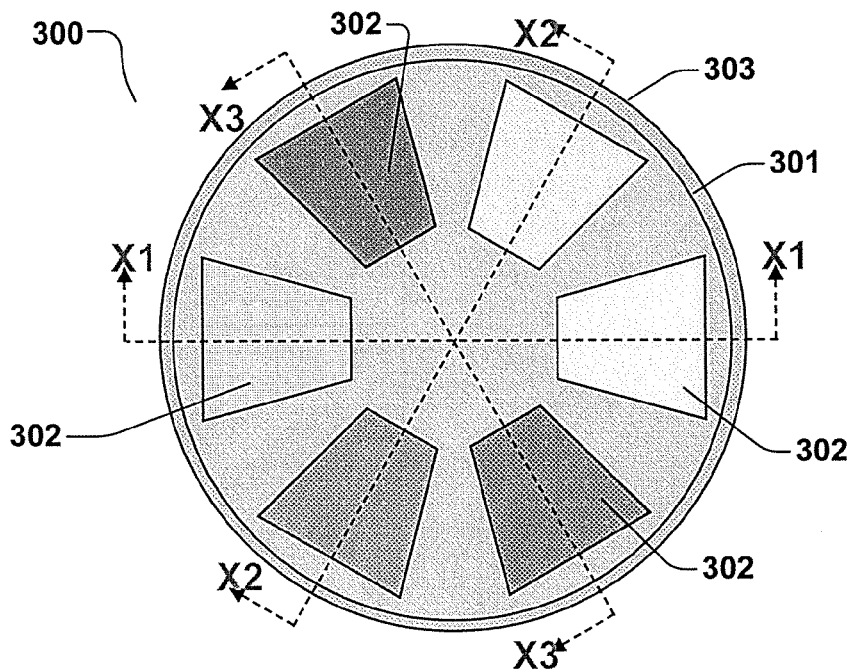
FIG. 3A illustrates a perspective view of a still further embodiment of a dipping plate in accordance with the disclosure.
Figure 3B:
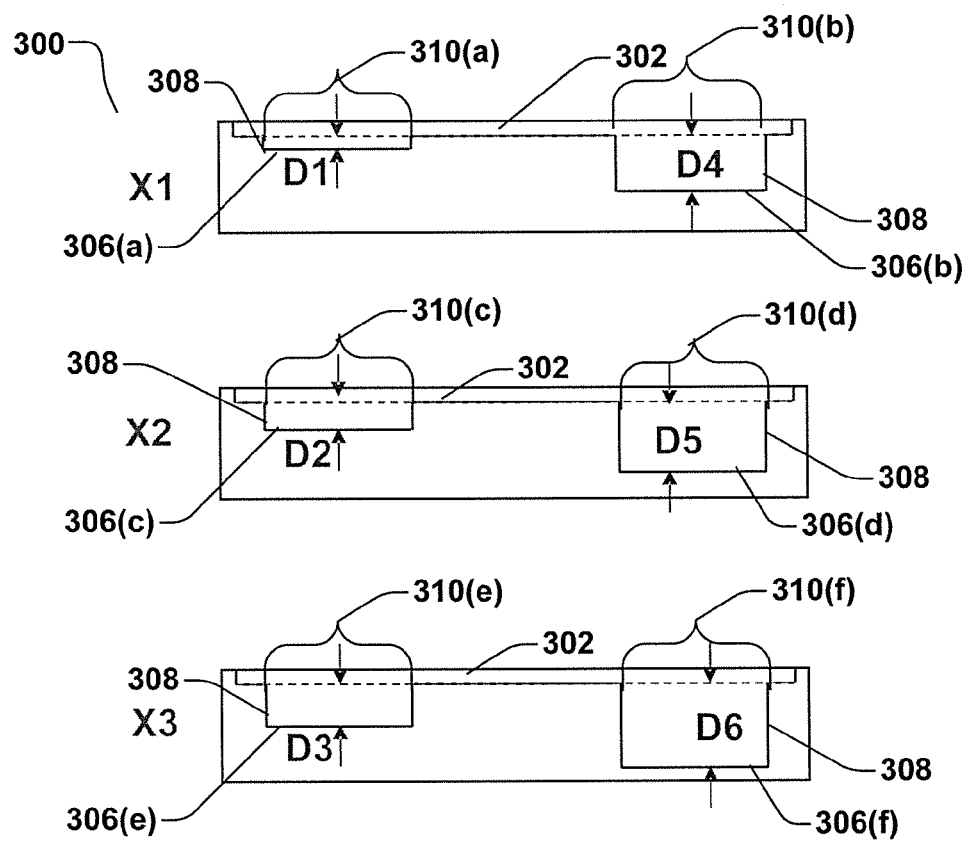
FIG. 3B illustrates a cross-sectional view through lines X1-X1, X2-X2 and X3-X3 of FIG. 5 of a further embodiment of a dipping plate of FIG. 3A in accordance with the disclosure.

In FIG. 3A an additional embodiment of an apparatus 300 disclosed herein is illustrated in which the dipping plate 301 is positioned in a circular configuration on a support 303. Dipping plate 301 comprises at least two reservoirs 302, and in the embodiment illustrated is shown as having six reservoirs 302. Reservoirs 302 have a stepped bottom 304, as illustrated in FIG. 3B, arranged to provide a plurality of depths of flux therein. The reservoirs 302 have at least two landing regions 306(a), 306(b) formed by vertical sidewalls 308 which meet between landing regions 306(a), 306(b), as shown in cross section X1-X1 of FIG. 3B. First 310(a) and second 310(b) dipping zones are formed by landing region 306(a), together with sidewall 308 and landing region 306(b) with sidewall 308 form a second dipping zone 310(b). Where additional dipping zones 310(c-f) are present in the dipping plate 301, these will be in isolated from the first 310(a) and second 310(b) dipping zones. Dipping zones 310(a-f) each have a different depth D1, D2, D3, D4, D5, D6.

Figure 4:
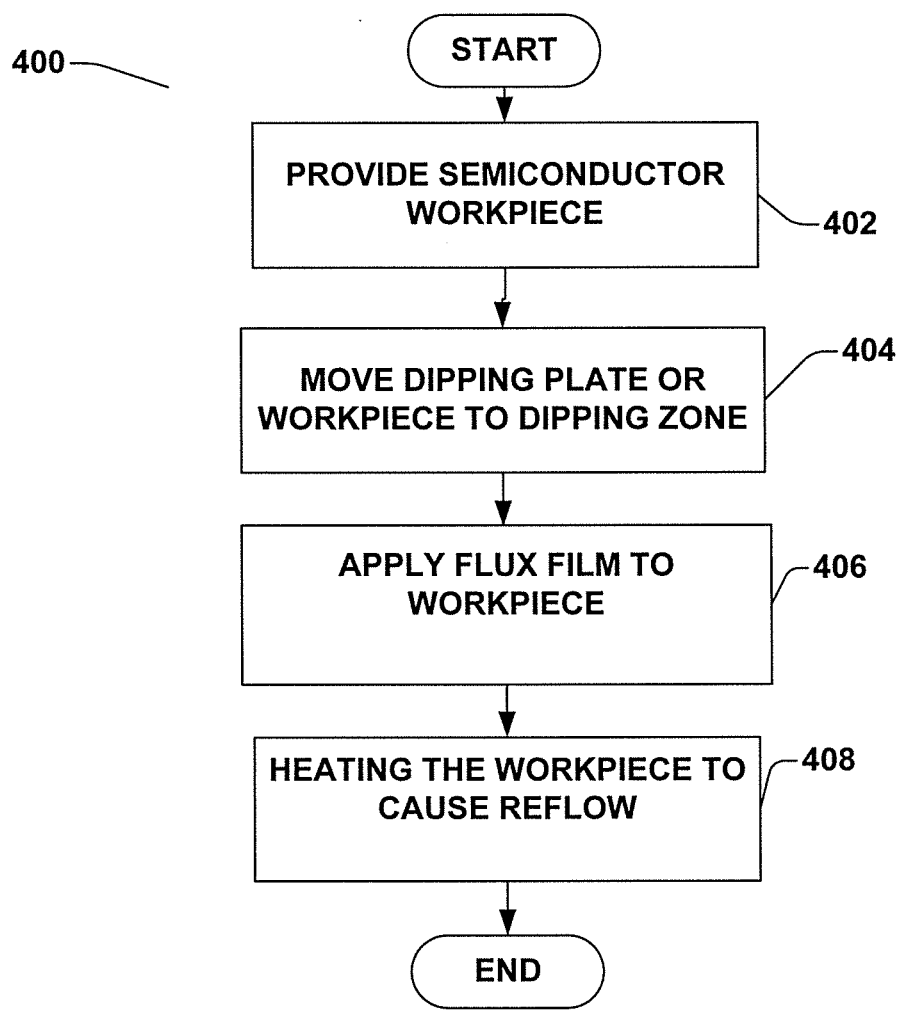
FIG. 4 illustrates a flow diagram of some embodiments of a method for applying a soldering flux to a semiconductor workpiece in accordance with the disclosure.

FIG. 4 illustrates a flow diagram of some embodiments of a method 400 for application of a soldering flux to a semiconductor workpiece. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 402 a semiconductor workpiece is provided. The workpiece includes solder contacts for mounting the workpiece.

At step 404, dipping plate is moved relative to the semiconductor workpiece to provide the dipping zone having an appropriate depth, or the semiconductor workpiece is moved to the dipping zone having the appropriate depth while dipping plate remains stationary. Dipping of the workpiece then proceeds at step 406. The amount of flux material applied will depend on, for example, the size of the workpiece, the number of terminals on the workpiece, the type of solder employed, and the type of flux employed. Generally, the soldering flux is applied to a depth of about one-third to about two-thirds of the height of the solder contacts.

At step 408, the workpiece is heated to reflow the solder, forming an electrical interconnection between parts, and the process ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a dipping plate for the application of a soldering flux to a workpiece. The workpiece can include a semiconductor die or a semiconductor package. The dipping plate includes a reservoir configured to contain a plurality of depths of flux.

In another embodiment, the disclosure relates to an apparatus for the application of soldering flux to a semiconductor workpiece comprising a reservoir for receiving a flux material and adapted to contain different depths of flux material. The apparatus further includes a support for supporting the dipping plate in a position to maintain the flux material at a uniform level across a level of the reservoir.

In a further embodiment, the disclosure relates to a method for the application of soldering flux to a semiconductor workpiece. The method comprises providing a semiconductor workpiece having solder contacts thereon. The method further comprises applying a film of flux to the solder contacts by dipping the workpiece in a dipping plate having a reservoir containing flux therein. The reservoir of the dipping plate is configured to provide at least a first and a second dipping zone, wherein the depth of the first dipping zone is different than the depth of the second dipping zone.

What is claimed is:

1. A system for application of soldering flux to a semiconductor workpiece, comprising:
    a flux dipping plate comprising:
        a reservoir configured to contain a plurality of depths of soldering flux therein;
        a plurality of dipping zones defined by a plurality of distinct bottom surfaces, respectively, within the reservoir and positioned in an arrangement of multiple rows and multiple columns, wherein, in the arrangement of multiple rows and multiple columns, a first dipping zone is adjacent to a second dipping zone along a row and is adjacent to a third dipping zone along a column, and wherein a first depth of the first dipping zone is different from the respective depths of the second and third dipping zones; and
    a support for supporting the flux dipping plate in a position to maintain a uniform level of soldering flux corresponding to a lower surface of the reservoir;
        wherein the first dipping zone meets the second and third dipping zones at respective vertical sidewalls; and
    soldering flux disposed within the reservoir of the flux dipping plate.

2. The system of claim 1, the reservoir having a stepped bottom.

3. The system of claim 1, wherein the flux dipping plate comprises from about 5 to about 6 dipping zones.

4. The system of claim 1, wherein the semiconductor workpiece comprises a semiconductor die or a semiconductor package.

5. The system of claim 1, wherein the soldering flux is configured to clean surface oxides from the semiconductor workpiece.

6. An apparatus and dipping plate for application of soldering flux to a semiconductor workpiece, comprising:
    an outer reservoir disposed within an upper surface of a dipping plate, the outer reservoir being circumscribed by an outer reservoir sidewall extending downwardly from the upper surface of the dipping plate to a lower surface of the outer reservoir;
    an inner reservoir surrounded by the lower surface of the outer reservoir and including an inner reservoir sidewall extending downwardly from the lower surface of the outer reservoir to a plurality of different depths below the lower surface of the outer reservoir, wherein the plurality of different depths correspond to bottom planar surfaces of a plurality of dipping zones, respectively;
    wherein the plurality of dipping zones are arranged in multiple rows and multiple columns, wherein first and second dipping zones along a row have first and second bottom surfaces at first and second different depths, respectively, and wherein third and fourth dipping zones along a column have third and fourth bottom surfaces at third and fourth different depths, respectively;
    wherein the first and second bottom surfaces are substantially planar surfaces that adjoin one another at a first substantially vertical sidewall and wherein the third and fourth bottom surfaces are substantially planar surfaces that adjoin one another at a second substantially vertical sidewall;
    a support for supporting the dipping plate in a position to maintain a uniform level of flux material corresponding to the lower surface of the outer reservoir; and
    soldering flux disposed within the inner reservoir and contacting the bottom planar surfaces of the plurality of dipping zones.

7. The apparatus and dipping plate of claim 6, wherein the lower surface of the outer reservoir is substantially planar and surrounds an entire outermost perimeter of the inner reservoir.

8. The apparatus and dipping plate of claim 7, wherein the plurality of dipping zones are in fluid connection with each other.

9. The system of claim 1, wherein the plurality of dipping zones are configured to alternate in depth.

10. The system of claim 1, wherein the plurality of dipping zones continuously increase in depth or continuously decrease in depth along a first direction of the dipping plate.

11. The apparatus and dipping plate of claim 6, wherein dipping zones along the row monotonically increase in depth or monotonically decrease in depth along a first direction of the dipping plate.

12. The apparatus and dipping plate of claim 11, wherein dipping zones along the column monotonically increase in depth or monotonically decrease in depth along a second direction, which is perpendicular to the first direction.

13. The apparatus and dipping plate of claim 6, wherein the plurality of dipping zones have respective substantially planar surfaces that are each below the lower surface of the outer reservoir, and wherein the lower surface of the outer reservoir is substantially planar and surrounds an entire outermost perimeter of the inner reservoir.

14. A system for applying soldering flux to a semiconductor workpiece, comprising:
a flux dipping plate comprising:
a reservoir configured to contain a plurality of depths of soldering flux therein; and
a plurality of dipping zones defined by a plurality of distinct bottom surfaces, respectively, within the reservoir and positioned in an arrangement of multiple rows and multiple columns, wherein, in the arrangement of multiple rows and multiple columns, a first dipping zone is adjacent to a second dipping zone along a row and is adjacent to a third dipping zone along a column, and wherein a first depth of the first dipping zone is different from the respective depths of the second and third dipping zones, and;
wherein the first dipping zone meets the second and third dipping zones at respective vertical sidewalls, and wherein dipping zones along the row monotonically increase in depth or monotonically decrease in depth along a first direction of the flux dipping plate; and
soldering flux having the plurality of depths disposed within the reservoir of the flux dipping plate.

15. The system of claim 14, wherein at least some of the plurality of dipping zones are in fluid connection with each other.

16. The system of claim 14, wherein all of the plurality of dipping zones are in fluid connection with each other.

17. The system of claim 14, wherein the reservoir comprises:
an outer reservoir disposed within an upper surface of the flux dipping plate, the outer reservoir being circumscribed by an outer reservoir sidewall extending downwardly from the upper surface of the flux dipping plate to a lower surface of the outer reservoir; and
an inner reservoir surrounded by the lower surface of the outer reservoir and including an inner reservoir sidewall extending downwardly from the lower surface of the outer reservoir to a plurality of different depths below the lower surface of the outer reservoir, wherein the plurality of different depths correspond to bottom planar surfaces of the plurality of dipping zones, respectively.

18. The system of claim 17, wherein the lower surface of the outer reservoir is substantially planar and surrounds an entire outermost perimeter of the inner reservoir.

19. The system of claim 17, wherein the flux dipping plate has exactly four dipping zones.

\* \* \* \* \*